United States Patent
DeLaPuente

(10) Patent No.: US 9,453,883 B2
(45) Date of Patent: Sep. 27, 2016

(54) DISTRIBUTED POWER SUPPLY ARCHITECTURE IN AUTOMATIC TEST EQUIPMENT

(71) Applicant: Advantest Corporation, Tokyo (JP)

(72) Inventor: Edmundo DeLaPuente, Cupertino, CA (US)

(73) Assignee: ADVANTEST CORPORATION, Tokyo (JP)

( * ) Notice: Subject to any disclaimer, the term of this patent is extended or adjusted under 35 U.S.C. 154(b) by 289 days.

(21) Appl. No.: 14/196,873

(22) Filed: Mar. 4, 2014

(65) Prior Publication Data

US 2015/0253378 A1    Sep. 10, 2015

(51) Int. Cl.
| G06F 1/00 | (2006.01) |
| G01R 31/00 | (2006.01) |
| G01R 31/319 | (2006.01) |

(52) U.S. Cl.
CPC ................. G01R 31/31907 (2013.01)

(58) Field of Classification Search
CPC ....................................................... G06F 1/3203
USPC ........................................................ 713/300
See application file for complete search history.

(56) References Cited

U.S. PATENT DOCUMENTS

| 3,670,230 A | 6/1972 | Rooney et al. |
| 4,220,926 A | 9/1980 | Buckner |
| 5,408,193 A | 4/1995 | Rodal |
| 6,456,099 B1 | 9/2002 | Eldridge et al. |
| 6,489,755 B1 | 12/2002 | Boudreaux, Jr. et al. |
| 6,900,621 B1* | 5/2005 | Gunther ........................ 323/266 |
| 6,958,598 B2* | 10/2005 | Xu ................... 324/537 |
| 7,853,828 B2* | 12/2010 | Johnson et al. ................ 714/37 |
| 7,863,888 B2* | 1/2011 | Xu ............................ 324/750.3 |
| 7,944,273 B1 | 5/2011 | Vinciarelli et al. |
| 8,718,967 B2* | 5/2014 | Filler et al. .................... 702/119 |
| 8,760,180 B1* | 6/2014 | King ........................ 324/750.02 |
| 9,267,965 B2* | 2/2016 | Jones et al. ............. 324/750.01 |
| 2004/0021507 A1 | 2/2004 | Fischer |
| 2006/0092675 A1 | 5/2006 | Kajita |
| 2015/0137839 A1* | 5/2015 | Jones et al. ............. 324/750.01 |
| 2015/0153405 A1* | 6/2015 | Wu et al. ..................... 324/73.1 |

FOREIGN PATENT DOCUMENTS

| JP | S61214771 | 9/1986 |
| JP | H07303030 | 11/1995 |
| JP | 2001085996 | 3/2001 |

* cited by examiner

*Primary Examiner* — Suresh Suryawanshi

(57) ABSTRACT

An apparatus for providing a distributed and scalable number of power supplies used in automatic test equipment. The apparatus includes at least one Pin Electronics (PE) module comprising a plurality of PE channels. The apparatus includes at least one programmable power supply (PPS) module comprising a plurality of programmable power supply channels, wherein the at least one PPS module is remote from the at least one PE module. That apparatus includes a test site controller executing a test program comprising a plurality of test instructions delivered over the plurality of Pin Electronics (PE) channels and the plurality of programmable power supply (PPS) channels in order to test a plurality of devices under test (DUTs) in parallel.

13 Claims, 6 Drawing Sheets

DISTRIBUTED POWER SUPPLY ARCHITECTURE IN AUTOMATIC TEST EQUIPMENT

BACKGROUND

The requirements of the system on chip (SOC) and SIP industry for ever higher speeds, performance and pin counts means that test systems must offer greater functionality while maintaining low cost of test. This may pose challenges when designing automatic test equipment (ATE) to be configurable to test different types of devices.

Automatic test equipment provides two types of resources: a) Pin Electronics (PE) channels and programmable power supplies (PPS) channels. The number of PE channels and the number of PPS channels in current testers can be scaled depending on the desired parallelism. However, the PE to PPS ratio tends to be inflexible. The reason for this is because the tester hardware of the ATE is broken into modules which contain a specific number of PE channels and PPS channels. That is, a module inflexibly includes x-PE channels and y-PPS channels. The way to scale the number of channels (e.g., either PE or PPS channels) is to add more tester modules. This increases both the PE and PPS channel counts together.

This PPS/PE ratio inflexibility causes problems in current implantation of ATEs. This is because the trend for test is to use just a few signal pins in test mode, but the number of power supplies remains un-changed. For example, inflexibility occurs when more of one resource is desired but none of the other (e.g., want more PPS channels, but no PE channels). In that case, when adding more modules to increase the desired resource, the number of undesired resource channels also increases. As such, historically, since it is impossible to control the ratio of PPS channels to the number of PE channels, the ATE hardware efficiency goes down.

SUMMARY

In embodiments of the present invention, an apparatus for providing a distributed and scalable number of power supplies used in automatic test equipment is described. The apparatus includes at least one Pin Electronics (PE) module comprising a plurality of PE channels. The apparatus includes at least one programmable power supply (PPS) module comprising a plurality of programmable power supply channels, wherein the at least one PPS module is remote from the at least one PE module. That apparatus includes a test site controller executing a test program comprising a plurality of test instructions delivered over the plurality of Pin Electronics (PE) channels and the plurality of programmable power supply (PPS) channels in order to test a plurality of devices under test (DUTs) in parallel.

In other embodiments of the present invention, a power supply source is described for providing power supplies used in automatic test equipment. The source includes a pool of power supplies comprising one or more power supply modules. The pool of power supplies is made available to a test site controller testing a plurality of devices. More particular, a representative power supply module comprises a bus interface for communicating with a common bus, wherein the test site controller sends an instruction over the common bus to a corresponding power supply module. The power supply module includes a local controller coupled to the bus interface for handling traffic local to a corresponding power supply module. The power supply module includes a programmable power supply controller coupled to the local controller and configured for controlling the plurality of programmable power supply channels, wherein the programmable power supply controller is configured to receive the instruction. The power supply module also includes a plurality of programmable power supply channels coupled to the programmable power supply controller, wherein at least one programmable power supply channel receives the instruction from the programmable power supply controller. Further, the power supply module is separated from a plurality of Pin Electronics channels.

In other embodiments, a method for providing automated testing of devices is described. The method includes providing at least one Pin Electronics (PE) module comprising a plurality of PE channels. The method includes providing at least one programmable power supply (PPS) module comprising a plurality of programmable power supply channels. The at least one PPS module is remote from the at least one PE module. The method includes configuring each of a pool of programmable power supply (PPS) channels to the at least one PE modules as controlled by a test site controller, wherein the at least one PPS module comprises the pool of PPS channels, each of which comprises a plurality of PPS digital channels, and wherein the at least one PPS module is remote from the at least one PE module.

These and other objects and advantages of the various embodiments of the present disclosure will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Accordingly, embodiments of the present disclosure provide for independent scaling of programmable power supply (PPS) modules/channels and Pin Electronics (PE) modules/channels in an automatic test equipment (ATE) environment. Other embodiments provide the above accomplishments and further provide for flexible PPS channel and PE channel allocation to a corresponding test site controller (TSC). In other embodiments, a remote power supply module architecture allows for more flexible PE/PPS resource allocation to a corresponding TSC.

Figure 1:
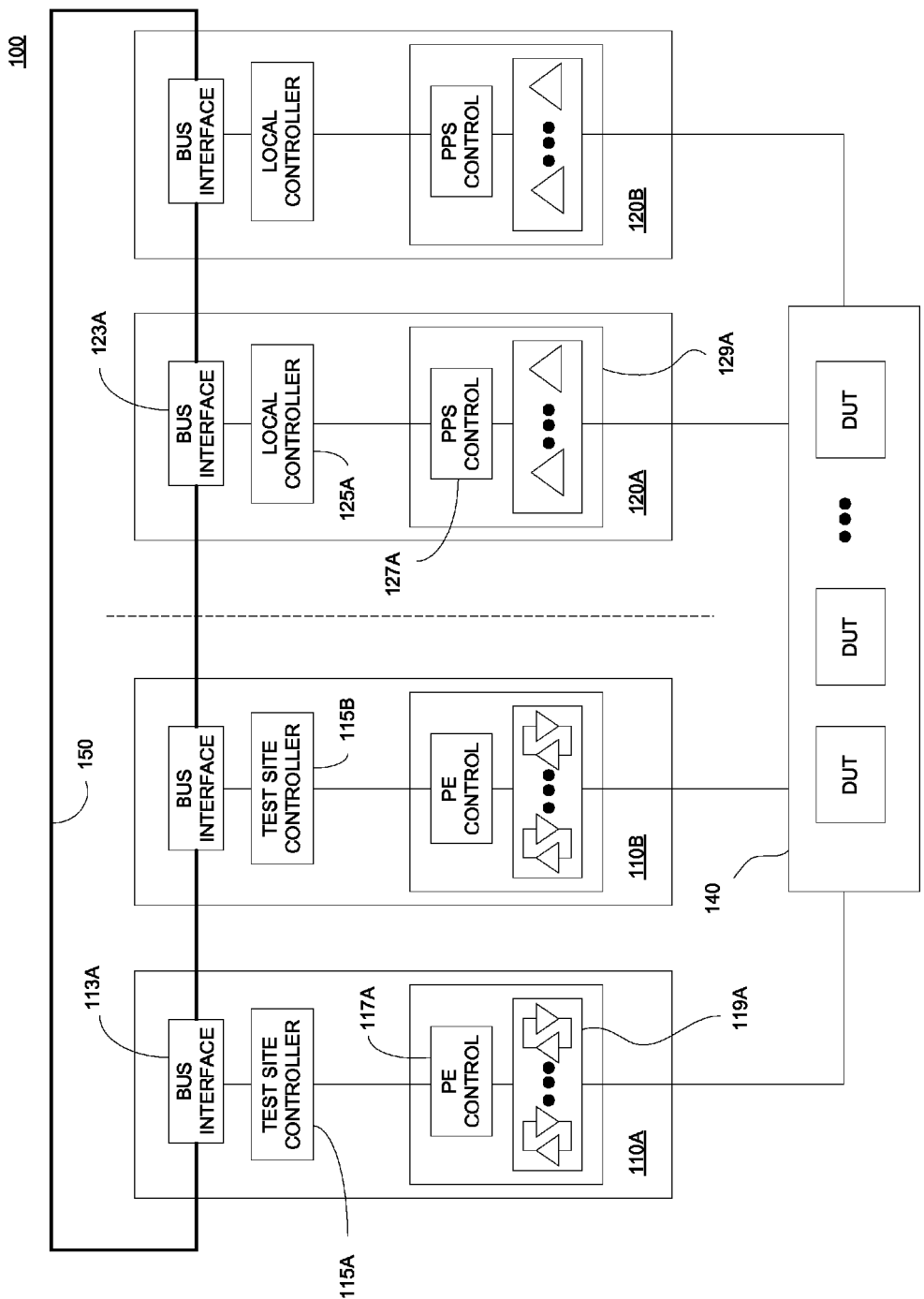
FIG. 1 depicts a block diagram of remote power supply module architecture, in accordance with one embodiment of the present disclosure.

FIG. 1 depicts a block diagram of system 100 including a remote power supply module architecture, in accordance with one embodiment of the present disclosure. The system 100 provides for flexible PE/PPS resource allocation to one or more test site controllers. This matches the trend to use less and less device under test (DUT) input/output (I/O) pins for device testing in favor of dedicated test pins, while the number of power supply pins per DUT remains constant. This is accomplished by separating the PPS modules providing programmable power supply channels from the PE modules providing Pin Electronics channels, and providing for configuring the number of programmable power supply channels freely. In turn, this flexibility reduces the about of resources required to test DUT parallelism, making the ATE more cost efficient.

As shown in FIG. 1, the system 100 includes one or more PE modules 110, such as, modules 110A and 110B. Though two PE modules are shown in FIG. 1, it is appreciated that system 100 can include a varying number of PE modules 110, such as one or more PE modules. Each Pin Electronics module 110 comprises a plurality of Pin Electronics channels, which can be coupled to a corresponding test pin of a device under test (DUT) to provide digital instructions to the DUT for purposes of testing, in one embodiment. In another embodiment, the PE channels may be coupled to I/O pins for the DUT to provide digital instructions used for testing.

Figure 2:
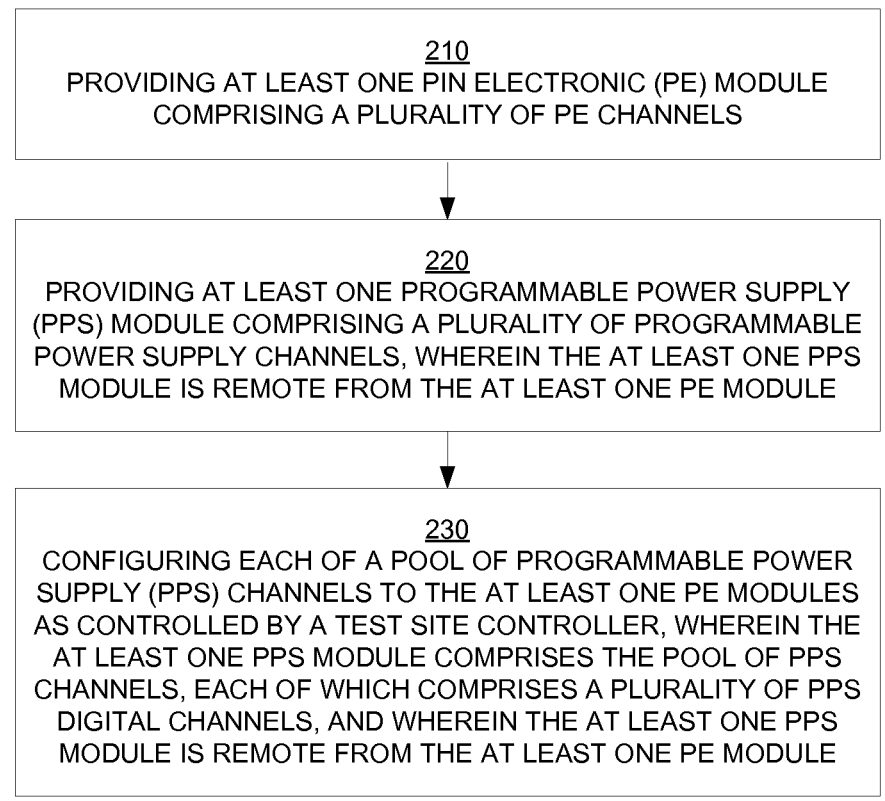
FIG. 2 is a flow diagram illustrating a method for independently scaling programmable power supply channels and Pin Electronics channels for allocation to a test site controller, in accordance with one embodiment of the present disclosure.

System 100 includes one or more PS modules 120, such as PS modules 120A and 120B. Though two power supply modules are shown in FIG. 2, it is appreciated that system 100 can include a varying number of PS module 120, such as one or more PS modules. Each PS module 120 comprises a plurality of power supply channels (e.g., 96 PS channels per PS module). In one embodiment, the power supply channels are programmable. As shown in FIG. 1, at least one PS module 120 is remote from a corresponding PE module 110.

Focusing on a representative PE module, such as, PE module 110A, system 100 includes one or more test site controllers for testing a plurality of DUTs within the ATE. That is the ATE is used to verify that the DUT functions properly. As examples, the DUT may include system-on-chip (SoC), memory devices (e.g., NAND), and other chip devices. More particularly, a test site controller executes a test program comprising a plurality of test instructions that are delivered over a corresponding plurality of Pin Electronics (PE) channels and a corresponding plurality of programmable power supply (PPS) channels in order to test a plurality of DUTs, in parallel. For instance, the test site controller manages and configures the resources (e.g., PE channels and PPS channels) and executes the test program.

For purposes of illustration, test site controller 115A is located on the PE module 113A in one embodiment. By localizing the TSC 115A to the PE module 110A, this allows for the least amount of delay when providing instructions from the TSC 115A to a plurality of PE channels 119A that are local the PE module 110A. Though the TSC 115A is shown located on the PE module, other embodiments provide for locating the TSC 115A remote from the PE channels, such as, on a satellite board that is coupled to one or more PE modules and PS modules. That is, the test site controller is independent of its corresponding PE module and PPS module. Still other test site controllers are associated with different PE channels and PPS channels for testing a different set of DUTs, in parallel. For example, test site controller 115B is located on PE module 110B, and is used to executes the same test program that are delivered over a different grouping of PE channels and different grouping of PPS channels in order to test a different grouping of DUTs, in parallel For example, test site controller 115A sends instructions directly to the PE control 117A, which distributes the instructions to the proper PE channels. That is, the PE control 117A understands which PE channels below to which test site controller. For purposes of efficiency, all of the PE channels 119A on the PE module may be allocated to TSC 115A. This is accomplished through a configuration file as accessed by the PE control 117A, which configures the PE channels 119A to the TSC 115A. In particular, at runtime, PE channels are tagged to belong to a particular test site controller (e.g., TSC 115A), so that the PE channels only respond to that test site controller. This is done through configuration files at the PE control 117A. In other embodiments, PE channels in the PE module may be assigned to two or more test site controllers, as defined by respective configuration files.

A test site controller (e.g., TSC 115A) is allocated one or more PPS channels, wherein the PPS channels are located across one or more PPS modules. In embodiments of the present invention, the PPS channels and/or PPS modules are remotely located from a corresponding test site controller, as well as the PE channels and/or PE modules associated with the test site controller.

Allocation of the PPS channels is accomplished through a configuration file, as will be further described below. During configuration, resources (e.g., PE channels and/or PPS channels) are assigned to each test site controller via software and user configuration files, for example. This flexible assignment of resources can change from application to application based on the DUT requirements and the desired parallelism.

For example, in one configuration, test site controller 115A is allocated programmable power supplies across two or more PS modules 120, such as PS modules 120A and 120B. Communication between the test site controller and the various PS modules is accomplished through a common interface 150 providing communications between the test site controller 115A, and PPS modules 120A and 120B. On a local level, bus interface 113A of PE module 110A provides for communication with the common interface 150.

More specifically, the communication interface 150 provides for communication between the various PE modules 110A and 110B, and the various PS modules 120A and 120B. In that manner, TSC 115A on PE module 110A is able to communicate with PS channels located on both PS modules 120A and 120B. In one embodiment, the communication interface 150 comprises a ring bus.

Focusing on a representative PS module, such as, PS module 120A, system 100 includes one or more PS modules providing a pool of power supplies, such as, programmable power supplies accessed through programmable power supply channels. The pool of programmable power supply channels, and correspondingly, the one or more power supply modules comprising the pool of programmable power supply channels is remote from a combination of: a corresponding test site controller, the PE modules and its PE channels. In addition, the pool of programmable power supply channels is made available to one or more test site controllers. For example, the pool of power supply channels is made available to a test site controller testing a plurality of devices.

As shown in FIG. 1, the PS module 120A includes a bus interface 123A for communicating with the common interface 150. For example, the test site controller 115A sends an instruction over the common interface 150 to a corresponding PS module (e.g., 120A and/or 120B). In that manner, the test site controller 115A is able to communicate with its allocated PPS channels, no matter which PS module those PPS channels are located.

In addition, the PS module 120A includes a local controller coupled to the communications interface 150 for handling local traffic. More specifically, the local controller 125A, at runtime, is slaved to the different test site controllers (e.g., TSC 115A and TSC 115B) that are trying to access its resources (e.g., PPS channels 129A). As a server, it handles the local traffic within the PS module 120A, and interfaces with the low level hardware. For example, the command protocol between TSC 115A and local controller 125A is reduced to simple commands and data, while most of the programming activity is delegated to the PPS control 127A.

More specifically, the programmable power supply controller 127A is coupled to the local controller 125A, and is configured for controlling the plurality of power supply channels 129A located on the PS module 120A. The programmable power supply controller 127A is configured to receive the instruction from the TSC 115A delivered over the communications interface 150 through the local controller 125A and deliver that instruction to at least one PPS channel in a proper grouping of PPS channels (e.g., associated with the TSC 115A) in the plurality of PPS channels 129A located on the PS module 120A. In particular, at runtime, PPS channels are tagged to belong to a particular test site controller (e.g., TSC 115A), so that the PPS channels only respond to that test site controller.

FIG. 2 is a flow diagram 200 illustrating a method for independently scaling programmable power supply channels and Pin Electronics channels for allocation to a test site controller, in accordance with one embodiment of the present disclosure. This accomplished by creating a pool of programmable power supply channels, wherein the total number of power supply channels in the pool is changeable.

At 210, the method includes providing at least one PE module comprising a plurality of PE channels. As previously described, the PE channels are configurable to couple to test pins and/or I/O pins of DUTs to receive instructions when conducting testing.

At 220, the method includes providing at least one PS module comprising a plurality of programmable power supply channels, wherein the at least one PS module is remote from the at least one PE module. That is, by providing a distributed PPS channel architecture, a pool of PPS channels is made available to one or more test site controller. In addition, on a system level, the pool size of PPS channels is increased or decreased by adding or removing PS modules.

Further, at least one PPS module comprises the pool of PPS channels, each of which comprises a plurality of PPS digital channels. That is, the pool of PPS channels may be spread across multiple PS modules. More particularly, at least one PPS module is remote from at least one PE module. That is, in the distributed architecture, each of the PPS modules is remote from the PE modules. Further, in one embodiment, the PPS modules are remote from the test site controllers. In that manner, the pool of PPS channels available to one or more test site controllers is changeable by increasing or decreasing the number of PS modules.

At 230, the method includes configuring each of a pool of programmable power supply (PPS) channels to a corresponding test site controller. Looking at it from the point of view of the test site controller, one or more PPS channels are allocated to the corresponding test site controller, wherein the test site controller executes a test program comprising a plurality of test instructions delivered over a corresponding set of associated PE channels and a corresponding set of PPS channels in order to test a plurality of DUTs, in parallel. At runtime, a corresponding test site controller programs its allocated resources (e.g., PE channels and/or PPS channels) via the bus interface hardware (e.g., 113A and 123A) located on each PE module and/or PS module and the common interface 150. The PPS channels and PE channels are tagged to belong to a particular test site controller, so that they only respond to that test site controller. This is done via the PE control (e.g., 117A for PE module 110A) and PPS control (e.g., 127A for the PS module 120A).

The channel assignment granularity, either PE channels or PPS channels, can be chosen when the ATE is being configured. That is, the granularity chosen is a trade-off between hardware complexity and cost vs. a desired flexibility. One example would be a granularity of 48 PE channels and one PPS channels, which is acceptable to many applications. Reducing this granularity on the PE channels may be desired in one embodiment, but it can be more expensive due to controller complexity.

In one embodiment the method includes configuring a scalable Pin Electronics to programmable power supply (PE/PPS) ratio for the entire system by adding or removing one or more power supply modules. In that manner, this increases or decreases the total number of PPS channels available in the pool of PPS channels that are used by one or more test site controllers. This is accomplished independent of the PE modules. The PE/PPS ratio for the entire ATE system is associated with the entirety of test site controllers within the system. Of course, at a granular level, each test site controller is configurable to allocate any number of PE channels and PPS channels. That is, at specific test site controller is able to configure a granular and scalable PE/PPS ratio by adding or removing one or more PPS channels to increase or decrease a total number of PPS channels Of course, in another embodiment, the method includes configuring a PE/PPS ratio for the entire system by adding or removing one or more Pin Electronics modules. In that manner, this increases or decreases the total number of PE channels available that are used by one or more test controllers. This is accomplished independent of the PS modules.

Figure 3:
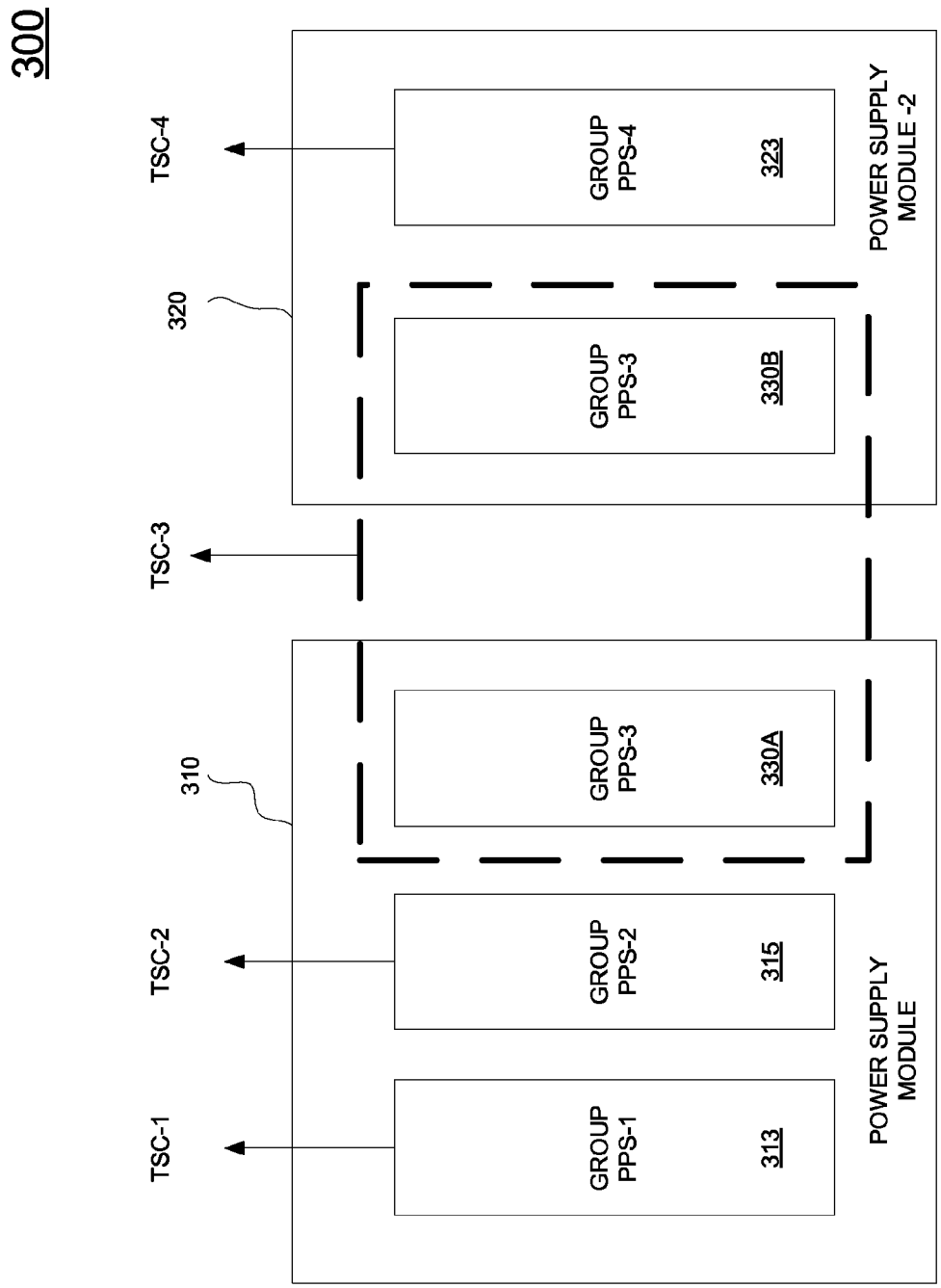
FIG. 3 is a block diagram illustrating the allocation of power supply channels across two or more power supply modules in association with a test site controller, in accordance with one embodiment of the present disclosure.

FIG. 3 is a block diagram illustrating the allocation of power supply channels across two or more power supply modules in association with a test site controller as implemented in a remote PS module architecture, in accordance with one embodiment of the present disclosure. The distribution of programmable power supply channels in the pool of PPS channels is spread across one or more PS modules, such as, PS module 310 and PS module 320. For instance, the PS module 310 includes various groupings of PPS channels allocated to one or more test site controllers. Also, the PS module 320 includes various groupings of PPS channels that are allocated to one or more test site controllers. In one embodiment, the PS modules 310 and 320 are remote from the PE modules and/or associated test site controllers.

For example, in PS module 310, a grouping of PPS channels 313 is allocated to TSC-1; and a grouping of PPS channels 315 is allocated to TSC-2; and a grouping of PPS channels 330A is allocated to TSC-3. Further, in PS module 320, a grouping of PPS channels 330B is allocated to TSC-3; and a grouping of PPS channels 323 is allocated to TSC-4.

In particular, a plurality of PPS channels that are associated with a specific test site controller, TSC-3, is spread across two or more PS modules, such as, PS module 310 and PS module 320. In one case, this occurs because the allocation of PPS channels is set depending on the number of DUTs to be tested per test site controller. As the PPS channels are allocated, a small remainder of PPS channels may remain in a specific PS module. Rather than wasting these PPS channels by not allocating them (e.g., because they do not fill a full set of PPS channels needed by a test site controller), these channels are combined with PPS channels from another PS module (e.g., group 330A of PS module 310 and group 330B of PS module 320). This provides for additional flexibility and maximum use of PPS resources during allocation.

Timing of the execution of instructions is more complicated when resources (e.g., PPS channels) are located across two or more modules (e.g., PS modules), such as, that described in FIG. 3. In one embodiment, synchronization between PPS channels is accomplished via one or more synchronization signals. Specifically, FIG. 4 is a block diagram of a remote power supply module architecture 400 including a satellite board for providing synchronization between Pin Electronics channels and programmable power supply channels located across a backplane supporting Pin Electronics modules and power supply modules in a quadrant of modules, in accordance with one embodiment of the present disclosure.

Figure 4:
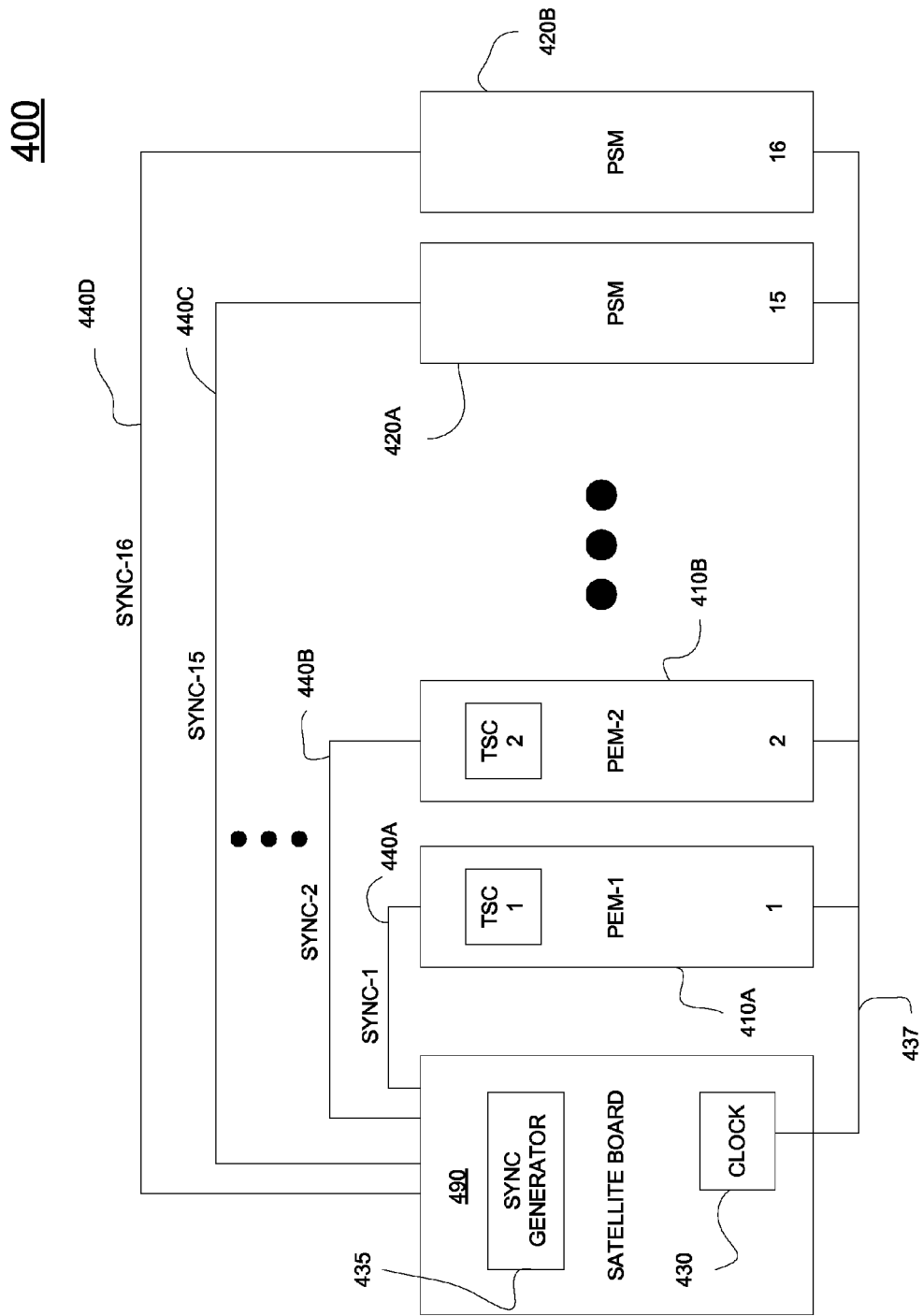
FIG. 4 is a block diagram of a remote power supply module architecture including a satellite board for providing synchronization between Pin Electronics channels and programmable power supply channels located across a backplane supporting Pin Electronics modules and power supply modules in a quadrant of modules, in accordance with one embodiment of the present disclosure.

As shown in FIG. 4, a quadrant of modules (e.g., PE and PS modules) includes sixteen modules, as numbered from the left beginning after the satellite board 490. It is appreciated that the quadrant may include any number of modules. The number of PE modules, as well as the number of PM modules are configurable depending on the ratio of PE/PPS channels desired and the degree of parallelism required. For example, the quadrant includes a certain number of PE modules. As shown in FIG. 4, the first module starting from the left is a PE module 410A, and the second module is a PE module 410B. Each of the PE modules 410A and 410B includes a test site controller for efficient communication, though that may not necessarily be the case, as previously described. Specially, PE module 410A includes TSC-1 and PE module 410B includes TSC-2.

In addition, a certain number of PS modules are included in the quadrant. As shown in FIG. 4, the fifteenth module is PS module 420A, and the sixteenth module is PS module 420B. For purposes of illustrating synchronization, a test site controller is allocated PPS channels spread across two or more PS modules, such as, PS module 420A and 420B. Other communication channels between the modules are not shown for clarity, such as, the communication interface 150 of FIG. 1 used to provide communication between the satellite board 490 and each of the modules (e.g., PE modules and PS modules) in the quadrant.

The remote power supply module architecture 400 includes a satellite board 490 configured for providing synchronization (e.g., timing) between one or more modules (e.g., modules 1-16 in the quadrant). For example, the satellite board 490 is used to synchronize the timing of the execution of an instruction distributed to PPS channels spread across two or more PS modules. In one illustration, synchronization signals are used to simultaneously execute an instruction (e.g., raise voltage on the power supplies connected to PPS channels) delisted to PPS channels on different PS modules. In another illustration, synchronization signals are used to execute multiple instructions at different times. For example, a DUT may have two power supply pins (e.g., Vcc-1 and Vcc-2). The timing for firing or executing an instruction on those power supply pins may occur at different times, in one case, where Vcc-1 is brought to 3.3 volts first , and then Vcc-2 is brought to 3.3 volts second. In another case, the timing for firing those power supply pins may occur at the same time.

The satellite board 490 provides the timing between the PE channels and the PPS channels on the various modules. For example, satellite board includes a synchronization generator 435 for generating a plurality of synchronization signals. In particular, each module is associated with its own synchronization signal. As such, synchronization generator 490 generates a first synchronization signal (SYNC-1) that is delivered to the first module (PEM 410A) over channel 440A, and a second synchronization signal (SYNC-2) that is delivered to second module (PEM 410B) over channel 440B, and additional synchronization signals for the rest of the modules. In particular, the synchronization generator 435 generates remaining synchronization signals for the remaining modules, such as, synchronization signal (SYNC-15) for the fifteenth module (PSM module 420A), and a synchronization signal (SYNC-16) for the sixteenth module (PSM module 420B).

In addition, the synchronization signals are further timed with a clock 430 generated by the satellite board, and delivered to each of the modules over communication interface 437. In that manner, the delivery of the synchronization signals (SYNC 1-16) is realigned to the clock so that each module is able to receive or determine the proper timing and sequence of the synchronization signals. As such, a first synchronization signal delivered to a first PS module and a second synchronization signal delivered to a second PS module are timed so that PPS channels are fired according to strict timing (e.g., simultaneously, at appointed times, etc.), in one embodiment.

In particular, in one embodiment, satellite board 490 is configured for receiving an instruction for programming a group of power supply channels spread across a first PS module (e.g., PS module 420A) and a second PS module (e.g., PS module 420B). The satellite board 490 is configured for providing a first synchronization signal (e.g., SYNC-1) for the first PPS module (e.g., module 420A) and a second synchronization signal (e.g., SYNC-2) for the second PPS module (e.g., module 420B) in response to the instruction. For example, the communication interface 437 couples the satellite board 490 and the first PS module (e.g., 420A) and the second PPS module (e.g., 420B). In one embodiment, the group of PPS channels that is located across at least two PS modules (e.g., 420A and 420B) is armed according to at least one programming instruction provided by a corresponding test site controller.

In addition, the first synchronization signal is delivered to the first PS module (e.g., 420A) at a first time based on the programming instruction. That is, the synchronization bus or communication interface 437 is configured for delivering the first synchronization signal (SYNC-1) to the first PS module (e.g., 420A) at a first appointed time. The first synchronization signal (SNC-1) is used to fire armed, programmable power supplies located on the first PS module (e.g., 420A). Previously, as described, the corresponding test site controller had armed the associated programmable power supplies located on the first PS module (e.g., 420A) in anticipation of receiving a corresponding synchronization signal.

Additionally, the second synchronization signal is delivered to the second PS module (e.g., 420B) at a second time based on the programming instruction. That is, the synchronization bus or communication interface 437 is configured for delivering the second synchronization signal (SYNC-1) to the second PS module (e.g., 420B) at a second appointed time. The second synchronization signal (SYNC-2) is used to fire armed, programmable power supplies located on the second PS (e.g., 420B) module. Previously, as described, the corresponding test site controller had armed the associated programmable power supplies located on the second PS module (e.g., 420B) in anticipation of receiving a corresponding synchronization signal.

In addition, a specific PS module may receive instructions from two or more test site controllers. To avoid collisions between instructions acting on the PS channels in the PS module, a locking mechanism is implemented in one embodiment. That is, a lock is configured for providing sole access to a corresponding PS module. As such, the holder (e.g., a test site controller) of the lock has sole access to the corresponding PS module. Access is specific to communication through the satellite board 490, in one embodiment, such that synchronization signals that are delivered as associated with a specific test site controller. In that manner, the test site controller is able to arm a specific group of PPS channels, and disarm remaining PPS channels in the PS module, and then instruct the synchronization board 490 to send an associated synchronization signal at the appropriate time. For example, a first lock is configured for providing sole access to a first PS module through the satellite board 490 to a test site controller holding the first lock. Also, a second lock is configured for providing sole access to a second PS module through the satellite board 490 to a test site controller holding the second lock.

Figure 5:
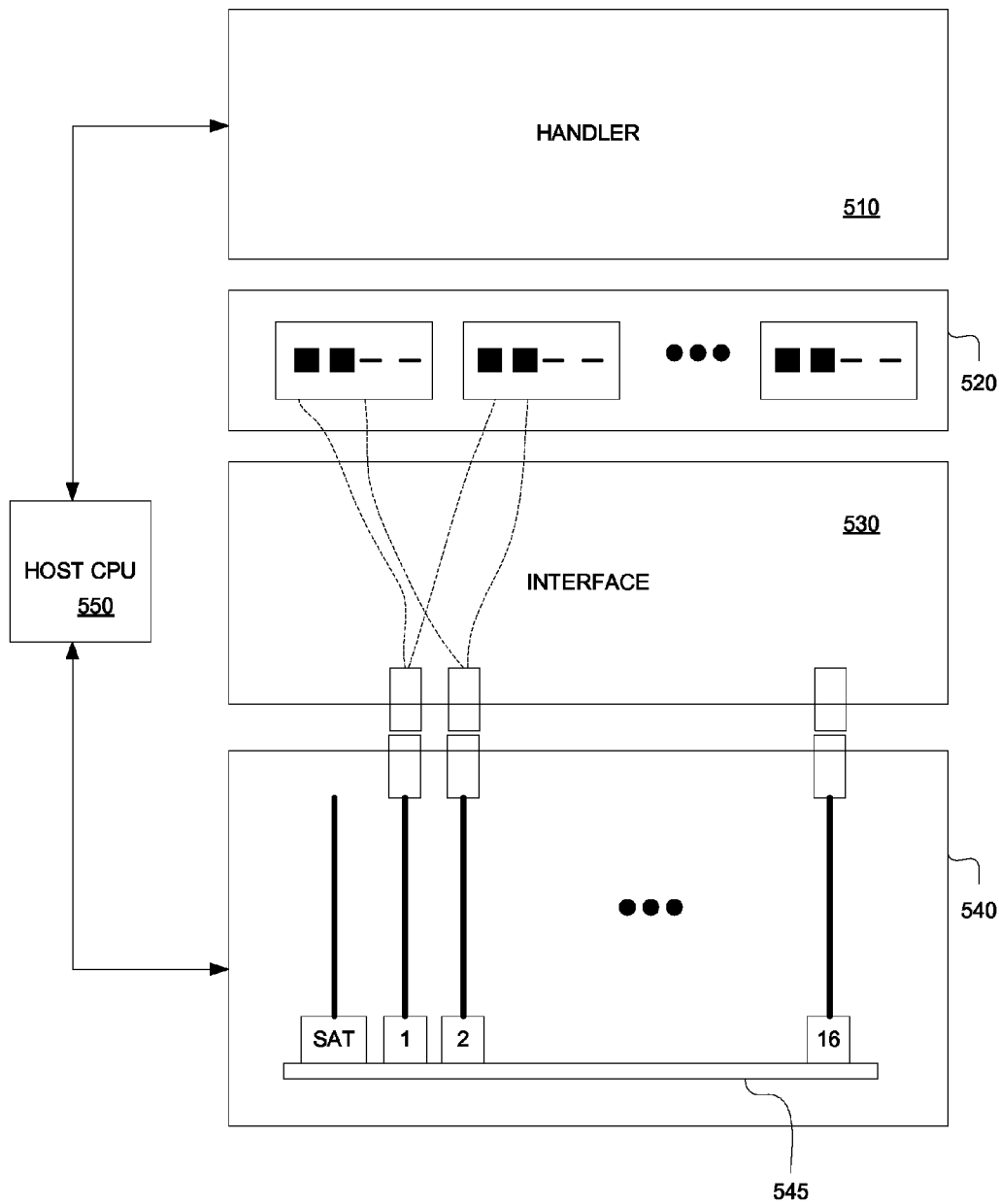
FIG. 5 is a block diagram of an automatic test equipment system providing a remote power supply architecture, in accordance with one embodiment of the present disclosure.

FIG. 5 is a block diagram of an automatic test equipment system 500 providing a remote power supply architecture, in accordance with one embodiment of the present disclosure. As shown, system 500 is configurable for independently scaling programmable power supply channels and Pin Electronics channels for allocation to a test site controller. System 500 is provided to illustration one implementation of an ATE system 500.

As shown in FIG. 5, system 500 includes a handler 510 that is configured for placing and removing DUTs from the socket boards located in the device specific assembly (DSA) 520. In addition to loading an unlading the DUTs from the socket boards, the handler 510 is able to sort the chips by quality after testing, in one implementation.

System 500 includes an interface 530 that is used to align the test pinouts or I/O pins on the DUTs located on the socket boards to PE channels located on PE modules. The interface 530 is also used aligning voltage pins on the DUTs located on the socket boards to PPS channels located on PS modules of a remotely distributed PS module architecture, wherein the PS modules are remote from the PE modules and/or the test site controllers.

System 500 includes a remote power supply module architecture 540 that is similar to the architecture 400 of FIG. 4. It is understood that ATE system 500 may include one or more remote power supply module architectures 540 for testing a scalable number of DUTs. As shown, the architecture 540 includes a backplane 545 configured for holding a satellite board and a plurality of modules (e.g., PE modules and PS modules). The backplane 545 is associated with a quadrant of modules, as previously described, in one embodiment. As such, each test site controller coupled to the backplane 545 executes a test program comprising a plurality of test instructions that are delivered over a corresponding plurality of PE channels and a corresponding plurality of PPS channels in order to test a plurality of DUTs, in parallel.

Further, the host central processing unit (CPU) 550 is configured for coordinating the overall testing process across all the components of the ATE system 500. For instance, the host CPU 550 coordinates the start of a test, so that the handler 510 understands when to load the DUTs into the socket boards, and so that the test site controller understand when to being testing the loaded DUTs. The host CPU 550 receives a signal indicating the end of a test run on a particular group of DUTs, and can instruct the handler to start offloading the DUTs, and partitioning them out according to quality metrics. Thereafter, the host CPU 550 coordinates another testing sequence.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "providing," "configuring," "arming," "delivering," "obtaining," "locking," or the like, refer to actions and processes (e.g., flowchart 200 of FIG. 2) of a computer system or similar electronic computing device or processor (e.g., system 100). The computer system or similar electronic computing device manipulates and transforms data represented as physical (electronic) quantities within the computer system memories, registers or other such information storage, transmission or display devices.

For example, FIG. 2 is a flowchart of an example of a method and/or computer-implemented method for independent scaling of programmable power supply channels and Pin Electronics channels for allocation during configuration to a test site controller, according to embodiments of the present invention. Although specific steps are disclosed in the flowcharts, such steps are exemplary. That is, embodiments of the present invention are well-suited to performing various other steps or variations of the steps recited in the flowcharts.

Other embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer storage media and communication media. Generally, program modules include routines, programs, objects, components, data structures, etc., that perform particular tasks or implement particular abstract data types. The functionality of the program modules may be combined or distributed as desired in various embodiments. For instance, flow diagram 200 is implemented within a computer system including a processor and memory coupled to the processor and having stored therein instructions that, if executed by the computer system causes the system to execute a method for independent scaling of programmable power supply channels and Pin Electronics channels for allocation during configuration to a test site controller. In still another embodiment, instructions for performing a method are stored on a non-transitory computer-readable storage medium having computer-executable instructions for causing a computer system to perform a method for independent scaling of programmable power supply channels and Pin Electronics channels for allocation during configuration to a test site controller. The method outlined in flow diagram 200 is implementable by one or more components of the computer system 600 of FIG. 6.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared and other wireless media. Combinations of any of the above can also be included within the scope of computer-readable media.

Figure 6:
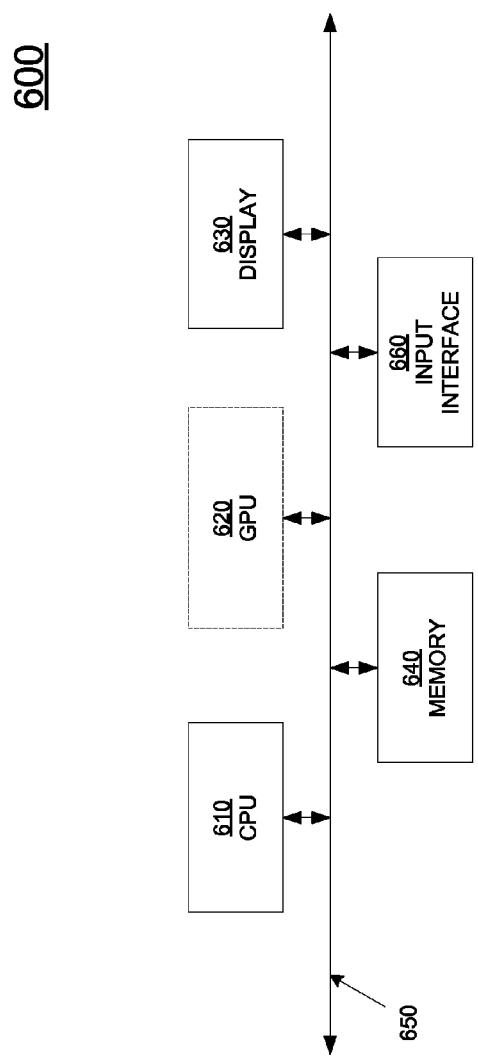
FIG. 6 is an exemplary computer system suitable for implementing the present methods, in accordance with one embodiment of the present disclosure.

FIG. 6 is a block diagram of an example of a computing system 600 capable of implementing embodiments of the present disclosure. Computing system 600 broadly represents any single or multi-processor computing device or system capable of executing computer-readable instructions. Examples of computing system 600 include, without limitation, automated test equipment, workstations, laptops, client-side terminals, servers, distributed computing systems, handheld devices, or any other computing system or device. In its most basic configuration, computing system 600 may include at least one processor 110 and a system memory 640.

Both the central processing unit (CPU) 610 and the optional graphics processing unit (GPU) 620 are coupled to memory 640. System memory 640 generally represents any type or form of volatile or non-volatile storage device or medium capable of storing data and/or other computer-readable instructions. Examples of system memory 640 include, without limitation, RAM, ROM, flash memory, or any other suitable memory device. In the example of FIG. 6, memory 640 is a shared memory, whereby the memory stores instructions and data for both the CPU 610 and the GPU 620. Alternatively, there may be separate memories dedicated to the CPU 610 and the GPU 620, respectively. The memory can include a frame buffer for storing pixel data drives a display screen 630.

The system 600 includes a user interface 660 that, in one implementation, includes an on-screen cursor control device. The user interface may include a keyboard, a mouse, and/or a touch screen device (a touchpad).

CPU 610 and/or GPU 620 generally represent any type or form of processing unit capable of processing data or interpreting and executing instructions. In certain embodiments, processors 610 and/or 620 may receive instructions from a software application or hardware module. These instructions may cause processors 610 and/or 620 to perform the functions of one or more of the example embodiments described and/or illustrated herein. For example, processors 610 and/or 620 may perform and/or be a means for performing, either alone or in combination with other elements, one or more of the monitoring, determining, gating, and detecting, or the like described herein. Processors 610 and/or 620 may also perform and/or be a means for performing any other steps, methods, or processes described and/or illustrated herein.

In some embodiments, the computer-readable medium containing a computer program may be loaded into computing system 600. All or a portion of the computer program stored on the computer-readable medium may then be stored in system memory 640 and/or various portions of storage devices. When executed by processors 610 and/or 620, a computer program loaded into computing system 600 may cause processor 610 and/or 620 to perform and/or be a means for performing the functions of the example embodiments described and/or illustrated herein. Additionally or alternatively, the example embodiments described and/or illustrated herein may be implemented in firmware and/or hardware.

Thus, according to embodiments of the present disclosure, systems and methods are described providing for independent scaling of programmable power supply channels and Pin Electronics channels within an ATE system and during allocation to a test site controller.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

While various embodiments have been described and/or illustrated herein in the context of fully functional computing systems, one or more of these example embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. These software modules may configure a computing system to perform one or more of the example embodiments disclosed herein. One or more of the software modules disclosed herein may be implemented in a cloud computing environment. Cloud computing environments may provide various services and applications via the Internet. These cloud-based services (e.g., software as a service, platform as a service, infrastructure as a service, etc.) may be accessible through a Web browser or other remote interface. Various functions described herein may be provided through a remote desktop environment or any other cloud-based computing environment.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the present disclosure are thus described. While the present disclosure has been described in particular embodiments, it should be appreciated that the disclosure should not be construed as limited by such embodiments, but rather construed according to the below claims.

What is claimed:

1. A system providing automatic testing of devices, comprising:
    at least one Pin Electronics (PE) module comprising a plurality of PE channels;
    at least one programmable power supply (PPS) module comprising a plurality of programmable power supply channels, wherein said at least one PPS module is remote from said at least one PE module; and
    a test site controller executing a test program comprising a plurality of test instructions delivered over said plurality of Pin Electronics (PE) channels and said plurality of programmable power supply (PPS) channels in order to test a plurality of devices under test (DUTs) in parallel,
    wherein said test site controller is located within a PE module providing said plurality of PE channels, and wherein said PE module is separate from said PPS module.

2. The system of claim 1, wherein said test site controller is independent of said at least one PE module and said at least one PPS module.

3. The system of claim 1, further comprising:
    a communication interface providing communications between said test site controller, said at least one PE module, and said at least one PPS module.

4. The system of claim 3, wherein said communication interface comprises a ring bus.

5. The system of claim 1, wherein said plurality of programmable power supply channels is spread across a first PPS module and a second PPS.

6. The system of claim 5, further comprising:
    a satellite board configured for receiving an instruction for programming a group of power supply channels spread across said first PPS module and said second PPS module, and configured for providing a first synchronization signal for said first PPS module and a second synchronization signal for said second PPS module in response to said instruction; and
    a synchronization bus coupling said satellite board and said first and second PPS modules, wherein said synchronization bus is configured for delivering said first synchronization signal to said first PPS module at an appointed time, wherein said first synchronization signal is used to fire armed programmable power supplies located on said first PPS module, and wherein said synchronization bus is configured for delivering said second synch signal to said second PPS module at a second appointed time, wherein said second synchronization signal is used to fire armed programmable power supplies located on said second PPS module.

7. The system of claim 6, wherein said , wherein said first and second synchronization signals are used to fire said plurality of programmable power supply channels simultaneously.

8. The system of claim 6, further comprising:
    a first lock configured for providing sole access to said first PPS module through said satellite board to a test site controller holding said first lock; and
    a second lock configured for providing sole access to said second PPS module through said satellite board to a test site controller holding said second lock.

9. A method for providing automated testing of devices, comprising:
    providing at least one Pin Electronics (PE) module comprising a plurality of PE channels;
    providing at least one programmable power supply (PPS) module comprising a plurality of programmable power supply channels, wherein said at least one PPS module is remote from said at least one PE module;
    configuring each of a pool of programmable power supply (PPS) channels to a corresponding test site controller, wherein said at least one PPS module comprises said pool of PPS channels, each of which comprises a plurality of PPS digital channels, and wherein said at least one PPS module is remote from said at least one PE module;
    arming a group of PPS channels that are located across at least two PPS modules according to at least one programming instruction provided by said test site controller;

delivering a first synchronization signal for said first PPS module at a first time based on said programming instruction, wherein said first synchronization signal is used to fire armed programmable power supplies in said group located on said first PPS module; and delivering a second synchronization signal for said second PPS module at a second time based on said programming instruction, wherein said second synchronization signal is used to fire armed programmable power supplies in said group located on said second PPS module.

10. The method of claim 9, wherein said test site controller executes a test program comprising a plurality of test instructions delivered over said plurality of Pin Electronics (PE) channels and said plurality of programmable power supply (PPS) channels in order to test a plurality of devices under test (DUTs) in parallel.

11. The method of claim 9, wherein said configuring each of a PPS channels further comprises: configuring a scalable Pin Electronics to programmable power supply (PE/PPS) ratio by adding or removing one or more PPS channels to increase or decrease a total number of PPS channels.

12. The method of claim 9, wherein said providing at least one Pin Electronics (PE) module further comprises: adding or removing one or more PPS modules to increase or decrease a total number of PPS channels available in said pool of programmable power supply (PPS) channels independent of a total number of PE channels.

13. The method of claim 9, further comprising: obtaining a first lock by said test site controller, wherein said first lock is configured for providing sole access to said first PPS module; and obtaining a second lock by said test site controller, wherein said second lock is configured for providing sole access to said second PPS module.

* * * * *